United States Patent
Nomura et al.

(10) Patent No.: US 11,744,155 B2
(45) Date of Patent: Aug. 29, 2023

(54) PIEZOELECTRIC ELEMENT

(71) Applicant: ROHM CO., LTD., Kyoto (JP)

(72) Inventors: Koji Nomura, Kyoto (JP); Nobufumi Matsuo, Kyoto (JP); Tomohiro Date, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 17/672,283

(22) Filed: Feb. 15, 2022

(65) Prior Publication Data

US 2022/0173302 A1    Jun. 2, 2022

Related U.S. Application Data

(63) Continuation of application No. 16/122,392, filed on Sep. 5, 2018, now Pat. No. 11,289,642.

(30) Foreign Application Priority Data

Sep. 6, 2017  (JP) ................. 2017-171445
Aug. 10, 2018 (JP) ................. 2018-152009

(51) Int. Cl.
| | | |
|---|---|---|
| *H10N 35/00* | (2023.01) | |
| *H10N 30/00* | (2023.01) | |
| *H10N 30/079* | (2023.01) | |
| *H10N 30/87* | (2023.01) | |
| *H10N 30/853* | (2023.01) | |
| *H10N 30/067* | (2023.01) | |
| *H10N 30/078* | (2023.01) | |

(52) U.S. Cl.
CPC ..... *H10N 30/10516* (2023.02); *H10N 30/079* (2023.02); *H10N 30/8554* (2023.02); *H10N 30/871* (2023.02); *H10N 30/877* (2023.02); *H10N 30/067* (2023.02); *H10N 30/078* (2023.02)

(58) Field of Classification Search
None
See application file for complete search history.

(56) References Cited

U.S. PATENT DOCUMENTS

2003/0234835 A1   12/2003   Torii et al.
2004/0200050 A1   10/2004   Komuro
(Continued)

FOREIGN PATENT DOCUMENTS

JP            2013229510          11/2013

*Primary Examiner* — Erica S Lin
(74) *Attorney, Agent, or Firm* — Hamre, Schumann, Mueller & Larson, P.C.

(57) ABSTRACT

A piezoelectric element 10 includes a lower electrode, constituted of a Pt/Ti laminated film, a PLT seed layer, formed on the lower electrode, a PZT piezoelectric film, formed on the PLT seed layer, and an upper electrode, formed on the PZT piezoelectric film. A curve Q1 is a curve drawn such as to pass through a plurality of plotted points, each expressing a PLT (100) peak intensity with respect to a Pt (111) peak intensity according to a substrate setting temperature during forming of the Pt/Ti laminated film. A relationship of the PLT (100) peak intensity with respect to the Pt (111) peak intensity is within a range in the curve Q1 until the PLT (100) peak intensity decreases by 5% from a peak point P, at which the PLT (100) peak intensity is the maximum, and a (100) orientation rate of PLT constituting the seed layer is not less than 85%.

9 Claims, 12 Drawing Sheets

(56) References Cited

U.S. PATENT DOCUMENTS

2010/0096666 A1* 4/2010 Ishida ............... H01L 41/318
  257/190
2012/0147101 A1 6/2012 Nawano
2015/0084486 A1* 3/2015 Eguchi ............. H01L 41/1875
  310/363

* cited by examiner

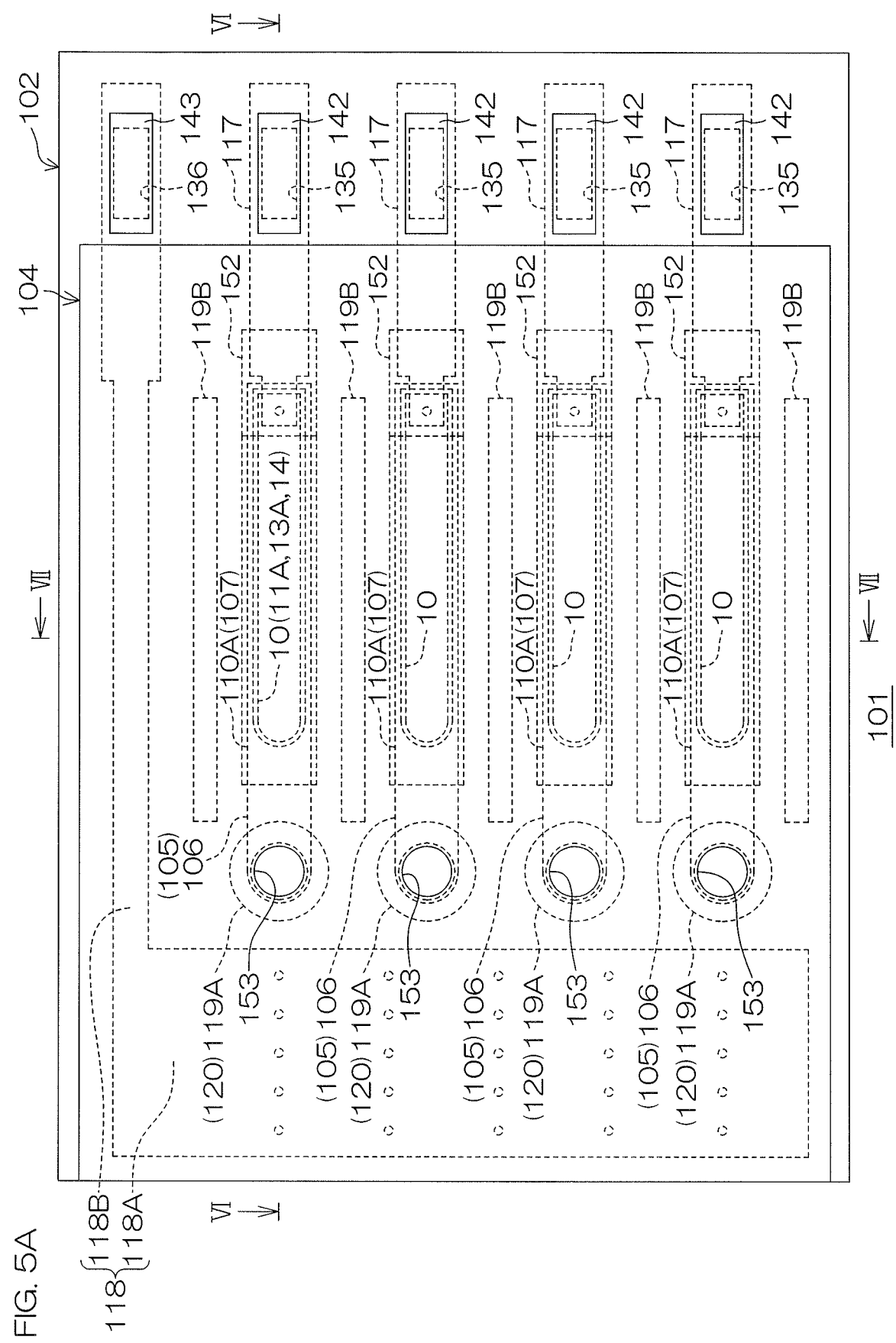

PIEZOELECTRIC ELEMENT

BACKGROUND OF THE INVENTION

1. Field of the Invention

The present invention relates to a piezoelectric element that includes a lower electrode disposed on a substrate, a seed layer formed on the lower electrode, and a piezoelectric film formed on the seed layer.

2. Description of the Related Art

There is known a piezoelectric element that includes a lower electrode disposed on a substrate, a piezoelectric film formed on the lower electrode, and an upper electrode formed on the piezoelectric film. As a representative piezoelectric film, there is lead zirconate titanate (PZT: $PbZr_xTi_{1-x}O_3$). PZT is a perovskite type ferroelectric substance and has excellent piezoelectric characteristics. Such a piezoelectric film is formed by a sputtering method, a sol-gel method, etc. Such a piezoelectric element is known to become higher in piezoelectric characteristics when the PZT is oriented in a (100) direction than in a (111) direction.

SUMMARY OF THE INVENTION

The inventor of preferred embodiments of the present invention described and claimed in the present application conducted an extensive study and research regarding a device using a piezoelectric element and a method for manufacturing the same, such as the one described above, and in doing so, discovered and first recognized new unique challenges and previously unrecognized possibilities for improvements as described in greater detail below.

Frequently with a piezoelectric element such as that described above, platinum (Pt), which has stability at high temperature and high conductivity is used as the lower electrode. Pt has a characteristic of readily undergoing self-orientation in the (111) direction. Although a piezoelectric film constituted of PZT becomes high in piezoelectric characteristics when it is in the (100) orientation, the piezoelectric film is influenced by the Pt that is its base and therefore PZT is unlikely to be formed in the (100) orientation on Pt of the (111) orientation. When the piezoelectric film is formed in the (111) orientation, its piezoelectric characteristics degrade.

An object of the present invention is to provide a piezoelectric element with high piezoelectric characteristics.

In order to overcome the previously unrecognized and unsolved challenges described above, a preferred embodiment of the present invention provides a device using a piezoelectric element. A first piezoelectric element includes a lower electrode, disposed on a substrate, a seed layer, formed on the lower electrode and constituted of a sputtered film having PLT as a main component, and a piezoelectric film, formed on the seed layer and having PZT or PLZT as a main component, and the lower electrode is constituted of a laminated film of a Ti film at the substrate side and a Pt film laminated on the Ti film. Also, when a (111) orientation peak intensity of the Pt constituting the Pt film is represented as a Pt (111) peak intensity on an abscissa, a (100) orientation peak intensity of the PLT constituting the seed layer is represented as a PLT (100) peak intensity on an ordinate, and a peak characteristic curve is a curve joining points of the PLT (100) peak intensity with respect to the Pt (111) peak intensity according to substrate setting temperature during forming of the lower electrode, a relationship of the Pt (111) peak intensity and the PLT (100) peak intensity is within a range in the peak characteristic curve until the PLT (100) peak intensity decreases by 5% from a peak point, at which the PLT (100) peak intensity in the peak characteristic curve is the maximum, and a (100) orientation rate of the PLT constituting the seed layer is not less than 85%.

With the present arrangement, the piezoelectric element, with which crystallinity and the (100) orientation of the PLT, constituting the seed layer formed on the Pt film, are satisfactory, is obtained. The (100) orientation of the PZT or the PLZT, constituting the piezoelectric film formed on the seed layer, can thereby be made high and the piezoelectric element having high piezoelectric characteristics is obtained.

A second piezoelectric element includes a lower electrode, disposed on a substrate, a seed layer, formed on the lower electrode and constituted of a sputtered film having PLT as a main component, and a piezoelectric film, formed on the seed layer and having PZT or PLZT as a main component, and the lower electrode is constituted of a laminated film of a Ti film at the substrate side and a Pt film laminated on the Ti film. Also, a (111) orientation peak intensity of the Pt constituting the Pt film is 17×10000 counts to 35×10000 counts and a (100) orientation rate of the PLT constituting the seed layer is not less than 85%.

With the present arrangement, the (100) orientation of the PLT, constituting the seed layer formed on the Pt film, can be improved. The (100) orientation of the PZT or the PLZT, constituting the piezoelectric film formed on the seed layer, can thereby be made high and the piezoelectric element having high piezoelectric characteristics is obtained.

In the preferred embodiment of the present invention, a film thickness of the seed layer is 20 nm to 100 nm, a film thickness of the Pt film is 50 nm to 200 mm, and a film thickness of the Ti film is not more than 10 nm.

In the preferred embodiment of the present invention, the piezoelectric film is a piezoelectric film formed by a sol-gel method.

In the preferred embodiment of the present invention, the seed layer has, near the lower electrode side, a Pb-rich layer high in Pb concentration.

The preferred embodiment of the present invention further includes an upper electrode formed on the piezoelectric film.

In the preferred embodiment of the present invention, an insulating film, constituted of $SiO_2$, is interposed between the substrate and the lower electrode.

In the preferred embodiment of the present invention, a lead barrier film, constituted of $Al_2O_3$, is interposed between the insulating film and the lower electrode.

In the preferred embodiment of the present invention, a film thickness of the insulating film is 300 nm to 2000 nm.

In the preferred embodiment of the present invention, a film thickness of the insulating film is 300 nm to 2000 nm and a film thickness of the lead barrier film is 50 nm to 100 nm.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 5A is an illustrative plan view for describing the arrangement of a main portion of an inkjet printing head in which the piezoelectric element of FIG. 1 is used.

DETAILED DESCRIPTION OF THE PREFERRED EMBODIMENTS

Figure 1:
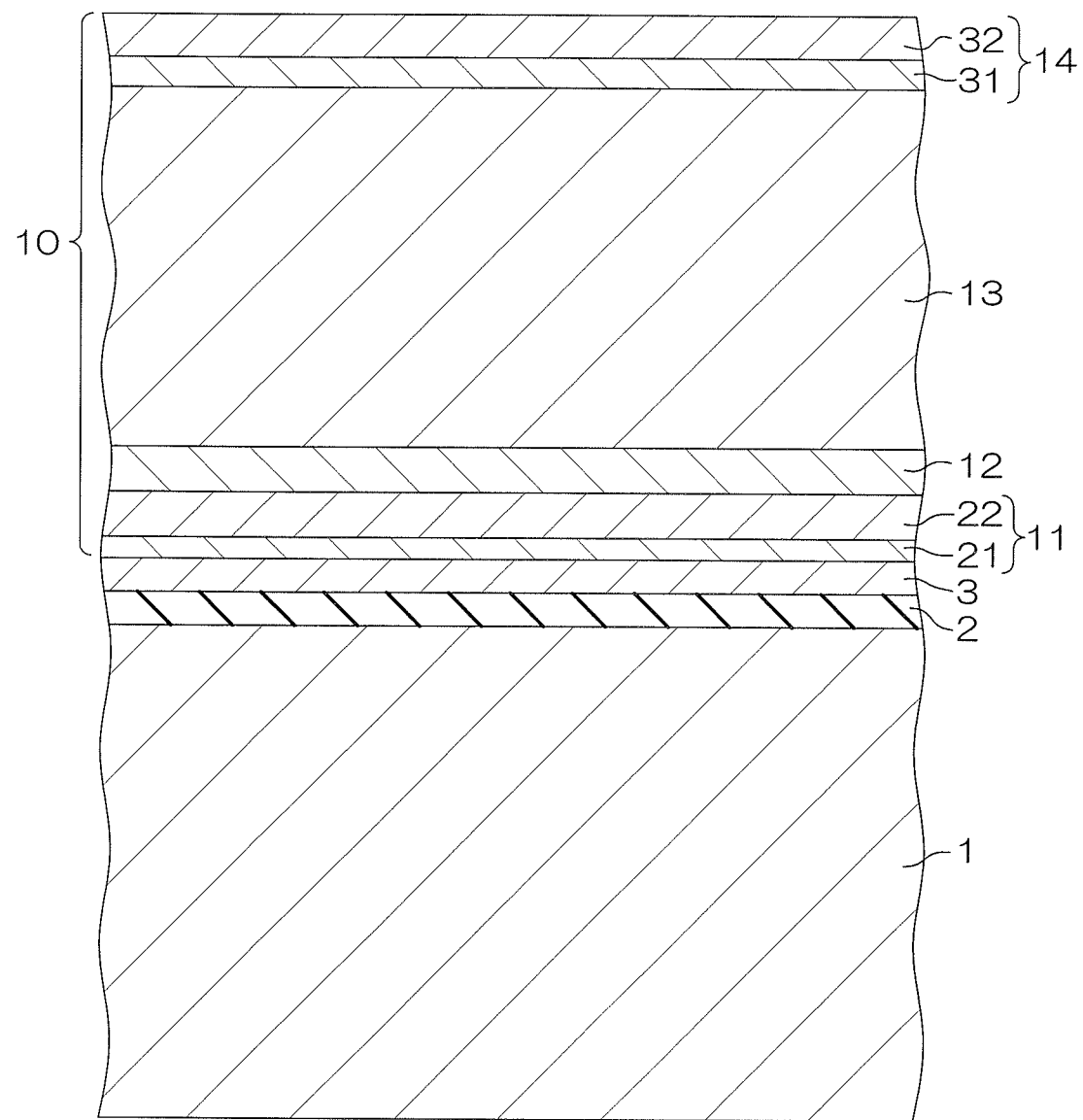
FIG. 1 is a schematic sectional view of a piezoelectric element according to a preferred embodiment of the present invention.

FIG. 1 is a schematic sectional view of a piezoelectric element according to a preferred embodiment of the present invention.

In the present preferred embodiment, the piezoelectric element 10 is formed in contact with a front surface of a lead barrier film 3 formed on a substrate 1. More specifically, an insulating film 2 is formed on a front surface of the substrate 1, and the lead barrier film 3 is formed on a front surface of the insulating film 2.

In the present preferred embodiment, the substrate 1 is constituted of a silicon substrate. A thickness of the silicon substrate 1 is approximately 100 μm to 1000 μm. The insulating film 2 is constituted of a silicon oxide film ($SiO_2$). A film thickness of the insulating film 2 is approximately 300 nm to 2000 nm. The lead barrier film 3 is constituted of alumina ($Al_2O_3$). A film thickness of the lead barrier film 3 is approximately 50 nm to 100 nm.

The piezoelectric element 10 includes a lower electrode 11, formed on the lead barrier film 3, a seed layer 12, formed on the lower electrode 11, a piezoelectric film 13, formed on the seed layer 12, and an upper electrode 14, formed on the piezoelectric film 13.

The lower electrode 11 is constituted of a laminated film (Pt/Ti laminated film) of a Ti (titanium) film 21, formed on the lead barrier film 3, and a Pt (platinum) film 22, formed on the Ti film 21. The Ti film 21 is formed to improve adhesion of the lead barrier film 3 and the Pt film 22. The Pt film 22 has a self-orientation property and is oriented in a (111) direction with respect to the substrate 1. A thickness of the Ti film 21 is approximately several nm to 10 nm, and a thickness of the Pt film 22 is approximately 50 nm to 200 nm. In the present preferred embodiment, the thickness of the Ti film 21 is 5 nm and the thickness of the Pt film 22 is 200 nm. The thickness of the Ti film 21 is preferably not more than 10 nm. The Ti film 21 and the Pt film 22 are formed by a sputtering method.

The seed layer 12 is a layer provided to improve crystal orientation of the piezoelectric film 13 formed on the seed layer 12. In the present preferred embodiment, the seed layer 12 is constituted from perovskite type lead lanthanum titanate (PLT: $PbLaTiO_3$). PLT is oriented in a (100) direction parallel to a plane (lamination plane) of the substrate 1. A thickness of the seed layer 12 is approximately 20 nm to 100 nm. In the present preferred embodiment, the thickness of the seed layer 12 is approximately 50 nm. The seed layer 12 is formed by the sputtering method. A Pb-rich layer, high in Pb concentration, is formed to approximately 20 nm at a portion inside the seed layer 12 near the lower electrode 11 side.

The seed layer 12 may be that with which PLT is doped with Mn (manganese), Mg (magnesium), Nb (niobium), Co (cobalt), Fe (iron), Ni (nickel), Zr (zirconium), Zn (zinc), Al (aluminum), Ta (tantalum), W (tungsten), Ti (titanium), etc. That is, it suffices that the seed layer 12 is constituted from a material having PLT as a main component.

In the present preferred embodiment, the piezoelectric film 13 is constituted from perovskite type lead zirconate titanate (PZT: $PbZr_xTi_{1-x}O_3$). A thickness of the piezoelectric film 13 is approximately 1000 nm to 3000 nm. In the present preferred embodiment, the piezoelectric film 13 is formed by a sol-gel method.

The piezoelectric film 13 may be constituted from lead lanthanum zirconate titanate (PLZT), with which a portion of the lead in lead zirconate titanate (PZT) is substituted by lanthanum. Also, the piezoelectric film 13 may be that with which PZT or PLZT is doped with Mn (manganese), Mg (magnesium), Nb (niobium), Co (cobalt), Fe (iron), Ni (nickel), Zr (zirconium), Zn (zinc), Al (aluminum), Ta (tantalum), W (tungsten), Ti (titanium), etc. That is, it suffices that the piezoelectric film 13 is constituted from a material having PZT as a main component or a material having PLZT as a main component.

In the present preferred embodiment, the upper electrode 14 is constituted from a laminated film ($Ir/IrO_2$ laminated film) of an $IrO_2$ (iridium oxide) film 31, formed on the piezoelectric film 13, and an Ir (iridium) film 32, formed on the $IrO_2$ film 31. A thickness of the upper electrode 14 is approximately 50 nm to 200 nm. The $IrO_2$ film 31 and the Ir film 32 are formed by the sputtering method. The upper electrode 14 may be constituted from a single film of Pt (platinum) instead.

Figure 2:
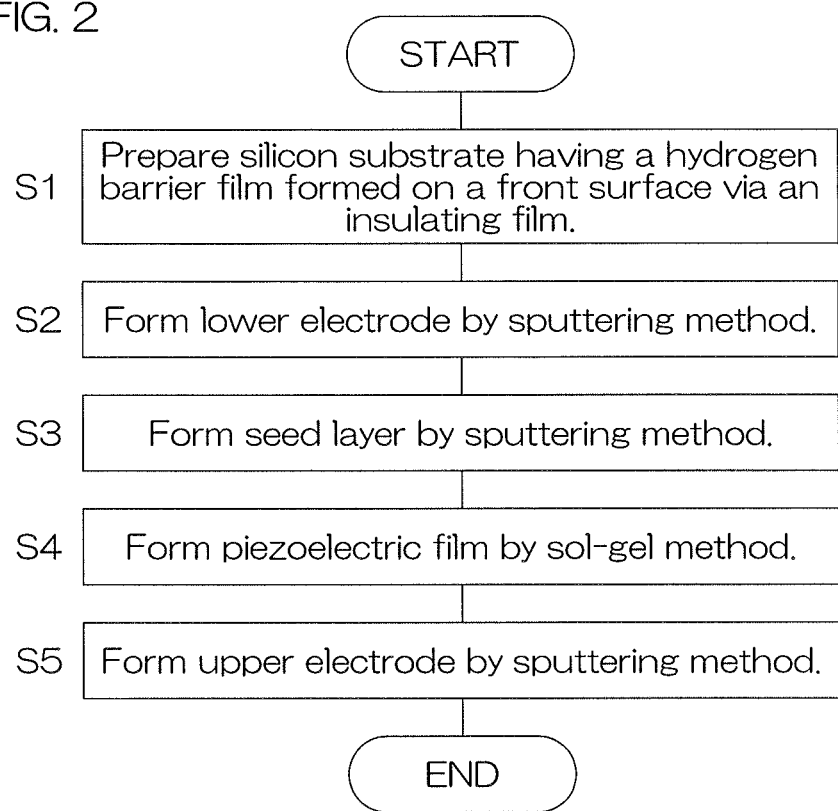
FIG. 2 is a flowchart of a manufacturing process of the piezoelectric element.

FIG. 2 is a flowchart of a manufacturing process of the piezoelectric element.

The silicon substrate 1, having the lead barrier film 3 formed on the front surface via the insulating film 2, is prepared (step S1). Such a silicon substrate 1 is obtained as follows. That is, first, the insulating film 2, constituted of a thermal oxide film ($SiO_2$) is formed on the substrate 1 by a thermal oxidation method. Next, the lead barrier film 3 is formed on the insulating film 2 by the sputtering method.

Next, the lower electrode 11 is formed on the lead barrier film 3 (step S2). Specifically, first, the Ti film 21 (of, for example, 5 nm) is formed on the lead barrier film 3 by the sputtering method. Next, the Pt film 22 (of, for example, 200 nm) is formed on the Ti film 21 by the sputtering method. A temperature of the substrate 1 during forming of the Pt/Ti laminated film by the sputtering method is preferably 515° C. to 575° C. The reason for this shall be explained later. The Pt constituting the Pt film 22 has the self-orientation property and is thus oriented in the (111) direction with respect to the substrate 1.

Next, the seed layer 12, constituted from PLT, is formed on the lower electrode 11 (Pt film 22) by the sputtering method (step S3). In this process, the lower an oxygen partial pressure or lower a sputtering gas pressure, the more a sputtering rate of Pb (lead) increases due to an increase in energy of Ar ions. The Pb-rich layer that is high in Pb concentration is thus formed at the portion of the seed layer 12 near the lower electrode 11 side.

Next, the piezoelectric film 13, constituted of PZT, is formed on the seed layer 12 by the sol-gel method (step S4).

Lastly, the upper electrode 14 is formed on the piezoelectric film 13 (step S5). Specifically, first, the IrO$_2$ film 31 is formed on the piezoelectric film 13 by the sputtering method. Next, the Ir film 32 is formed on the IrO$_2$ film 31 by the sputtering method. The piezoelectric element 10, constituted of the lower electrode 11, the seed layer 12, the piezoelectric film 13, and the upper electrode 14, is thereby obtained.

During the forming of the Pt film 22 on the Ti film 21 by the sputtering method, the Ti in the Ti film 21 diffuses into the Pt film 22. When the Ti diffuses to a front surface of the Pt film 22 at an opposite side from the Ti film 21, titanium monoxide (TiO) is formed on the front surface of the Pt film 22. It is considered that if TiO is formed on the front surface of the Pt film 22, then during forming of the seed layer 12 on the Ti film 21, the TiO bonds with the Pb of PLT to form PbTiO$_3$ and becomes a nucleus of a PLT crystal and the PLT undergoes crystal growth. It is thus considered that if TiO can be formed at a proper density on the front surface of the Ti film 21, PLT would improve in crystallinity and the (100) orientation of the PLT constituting the seed layer 12 can be made high.

In the present preferred embodiment, by setting the temperature of the silicon substrate 1 during the forming of the Pt/Ti laminated film (lower electrode 11) by the sputtering method to an appropriate temperature, TiO is formed at the proper density on the front surface of the Ti film 21 and the (100) orientation of the PLT formed on the Pt film 22 is made high. The (100) orientation of the PZT, constituting the piezoelectric film 13 formed on the seed layer 12, can thereby be made high and the piezoelectric element having high piezoelectric characteristics is obtained. A proper temperature range of the silicon substrate 1, etc., during the forming of the Pt/Ti laminated film (lower electrode 11) shall be described later.

Figure 3:
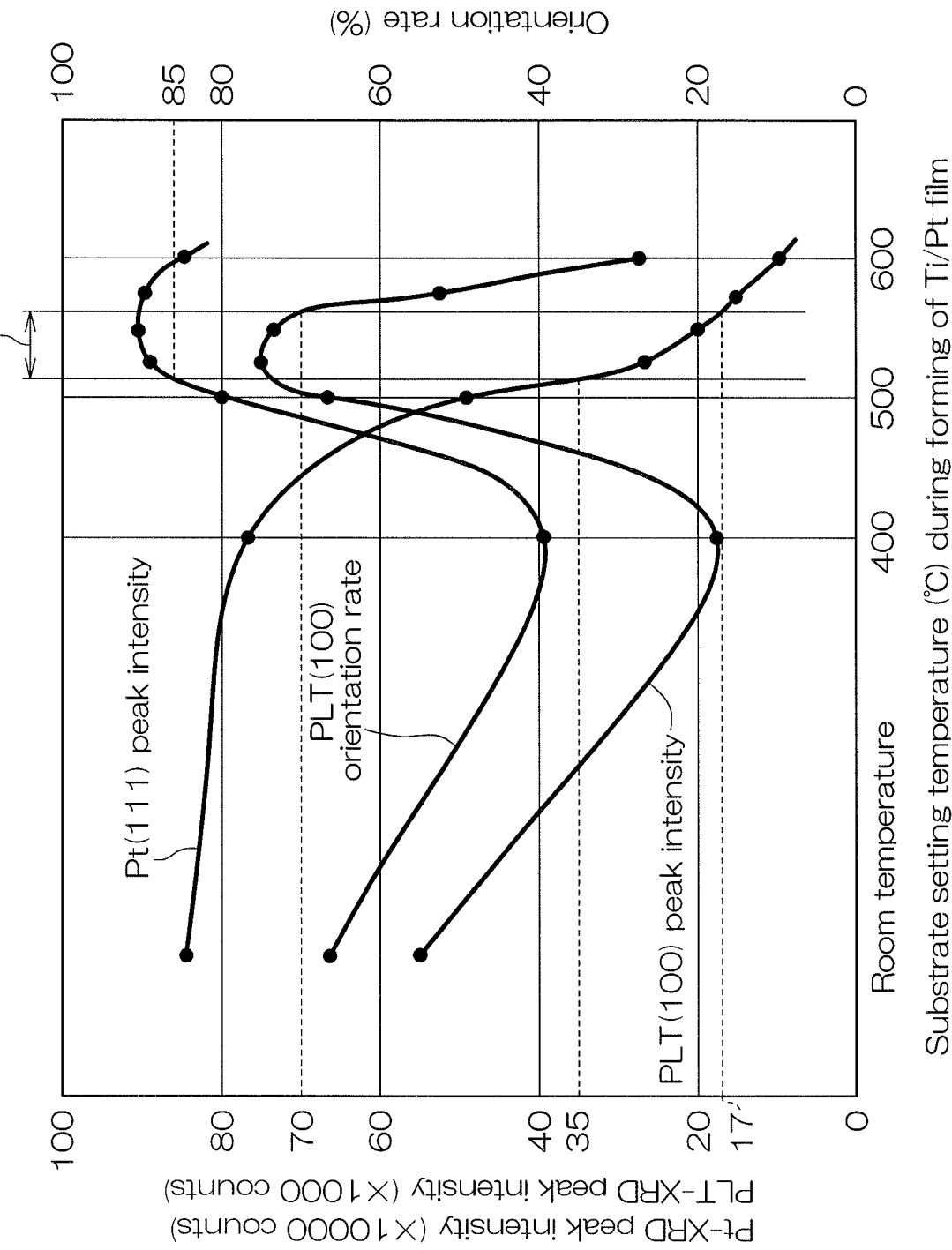
FIG. 3 is a graph showing Pt (111) peak intensity, PLT (100) peak intensity, and PLT (100) orientation rate with respect to substrate setting temperature during forming of a Pt/Ti laminated film.

FIG. 3 is a graph showing Pt (111) peak intensity, PLT peak intensity, and PLT (100) orientation rate with respect to substrate setting temperature during the forming of the Pt/Ti laminated film.

The graph of FIG. 3 is prepared as follows. A plurality of samples, each constituted of the lower electrode 11 and the seed layer 12, were prepared with the substrate setting temperature during the forming of the lower electrode being changed. Each sample is formed on the lead barrier film 3 formed, via the insulating film 2, on the silicon substrate 1. Then, with each sample, 2θ/θ XRD (X-ray diffraction) measurement was performed to measure the Pt (111) peak intensity [counts], PLT (100) peak intensity [counts], PLT (111) peak intensity [counts], and the PLT (100) orientation rate [%].

The Pt (111) peak intensity is an intensity of a peak that indicates the (111) orientation of the Pt constituting the Pt film 22 inside the lower electrode 11.

The PLT (100) peak intensity is an intensity of a peak that indicates the (100) orientation of the PLT constituting the seed layer 12.

The PLT (111) peak intensity is an intensity of a peak that indicates the (111) orientation of the PLT constituting the seed layer 12.

The PLT (100) orientation rate D is a value expressing the (100) orientation of the PLT constituting the seed layer 12 and is calculated based on the following formula:

$$D=\{PLT(100)\text{peak intensity}/(PLT(100)\text{peak intensity}+PLT(111)\text{peak intensity})\}\times 100 \ldots \quad (1)$$

From FIG. 3, it may be considered that a range in which the crystallinity and the orientation rate of PLT (100) are satisfactory is a range in which the PLT (100) orientation rate D is not less than 85% and the PLT (100) peak intensity is within a range of being decreased by 5% from its maximum peak. With the example of a PLT (100) peak intensity curve of FIG. 3, the peak intensity at a point at which the PLT (100) peak intensity is decreased by 5% from the PLT (100) peak intensity of the maximum peak is deemed to be 70×1000 counts.

It is thus preferable to set the substrate setting temperature during the forming of the Pt/Ti laminated film to 515° C. to 575° C. In other words, with the example of FIG. 3, it is preferable for the Pt (111) peak intensity to be 17×10000 counts to 35×10000 counts, the PLT (100) peak intensity to be not less than 70×1000 counts, and the PLT (100) orientation rate to be not less than 85%.

Figure 4:
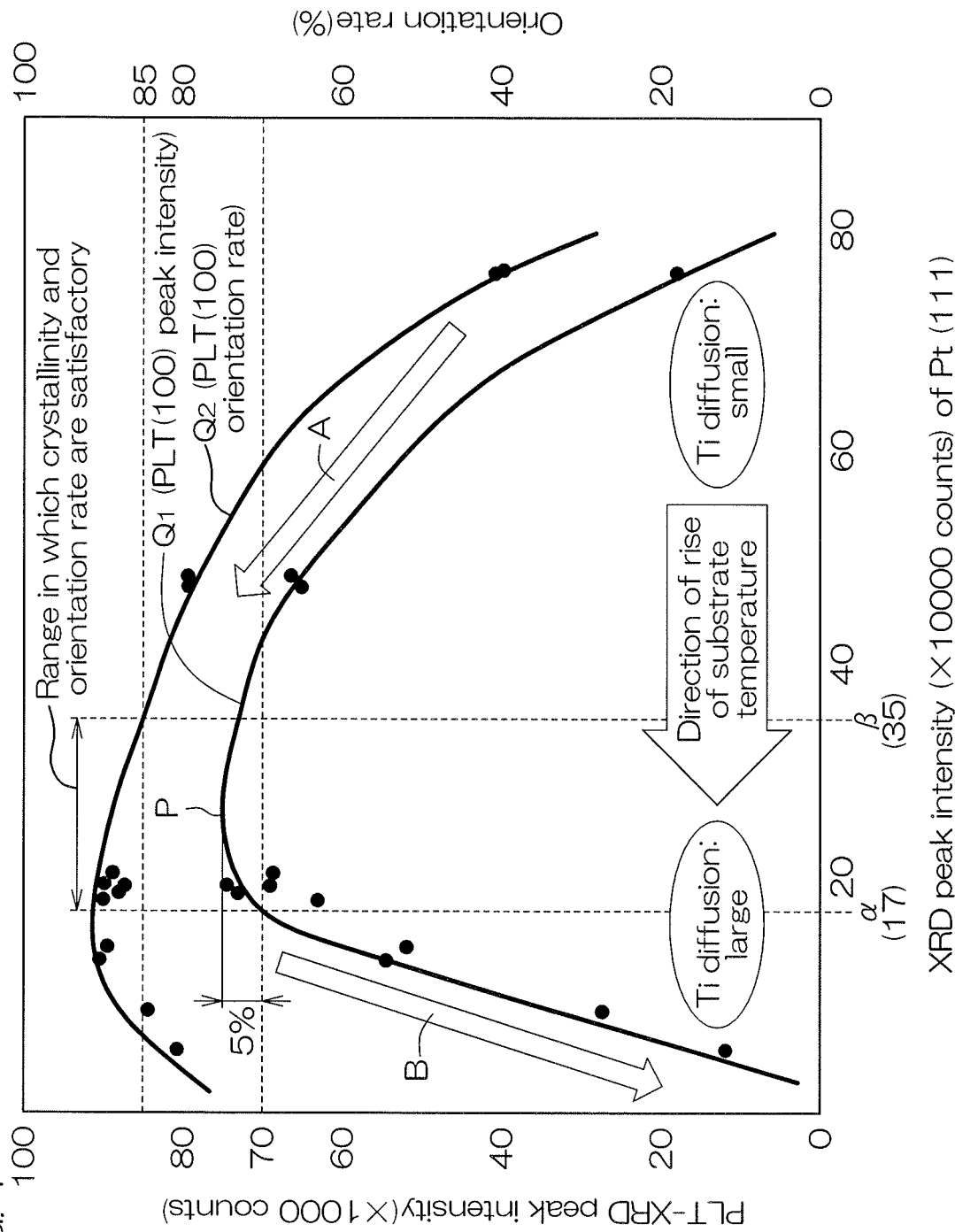
FIG. 4 is a graph showing relationships of the PLT (100) peak intensity and the PLT (100) orientation rate with respect to the Pt (111) peak intensity.

FIG. 4 is a graph showing relationships of the PLT (100) peak intensity and the PLT (100) orientation rate with respect to the Pt (111) peak intensity.

The graph of FIG. 4 is prepared based on data obtained from a plurality of samples, such as described with FIG. 3, that differ in the substrate setting temperature during the forming of the Pt/Ti laminated layer. The data obtained from each sample are the Pt (111) peak intensity, the PLT (100) peak intensity, the PLT (111) peak intensity, and the PLT (100) orientation rate.

In FIG. 4, a curve Q1 is a curve (peak characteristic curve) drawn such as to pass through a plurality of plotted points, each expressing the PLT (100) peak intensity with respect to the Pt (111) peak intensity according to the substrate setting temperature during the forming of the Pt/Ti laminated film (according to sample).

In FIG. 4, a curve Q2 is a curve drawn such as to pass through a plurality of plotted points, each expressing the PLT (100) orientation rate with respect to the Pt (111) peak intensity according to the substrate setting temperature during the forming of the Pt/Ti laminated film (according to sample).

The curve Q1 has a peak point (maximum point) P, at which the PLT (100) peak intensity is the maximum, when the Pt (111) peak intensity is substantially 24×10000 counts. In the curve Q1, an interval of the Pt (111) peak intensity from 80×10000 counts to 24×10000 counts shall be referred to as a first interval and an interval of the Pt (111) peak intensity of not more than 24×10000 counts shall be referred to as a second interval.

In the first interval, the PLT (100) peak intensity increases as the Pt (111) peak intensity decreases as indicated by an arrow A. The reason for this shall now be explained. The higher the substrate setting temperature during the formation of the Pt/Ti laminated film, the greater a diffusion amount of Ti diffusing into the Pt film 22 and therefore, the lower the Pt (111) peak intensity. Therefore, as the Pt (111) peak intensity decreases from 80×10000 counts, the density of the titanium monoxide (TiO) formed on the Pt film 22 front surface increases and the crystallinity of the PLT of the PLT seed layer 12 increases. Therefore, in the first section, the PLT (100) intensity increases as the Pt (111) peak intensity decreases.

In the second interval, the PLT (100) peak intensity decreases sharply as the Pt (111) peak intensity decreases as indicated by an arrow B. The reason for this shall now be explained. The higher the substrate setting temperature during the formation of the Pt/Ti laminated film, the greater the diffusion amount of Ti diffusing into the Pt film. However, it is considered that when the amount of Ti diffusing to the Pt film 22 front surface exceeds a certain amount, titanium dioxide ($TiO_2$), which does not become a nucleus of a PLT crystal, is formed on the front surface of the Pt film 22 and crystal growth of PLT is inhibited by the $TiO_2$. Therefore, in the second section, the PLT (100) peak intensity decreases sharply as the Pt (111) peak intensity decreases. In the following, the point on the curve Q1 at which the PLT (100) peak intensity is the maximum shall be referred to as the peak point P.

From FIG. 4, it may be considered that a range in which the crystallinity and the orientation rate of PLT (100) are satisfactory is a range in which the PLT (100) orientation rate is high and an influence of the sharp decrease of the PLT (100) peak intensity due to PLT crystal growth inhibition by $TiO_2$ is small.

From FIG. 4, the range in which the influence of the sharp decrease of the PLT (100) peak intensity is small is a range where the relationship of the PLT (100) peak intensity with respect to the Pt (111) peak intensity is within a range in the curve Q1 until the PLT (100) peak intensity decreases by 5% from the peak point P (within a range of not less than 70×1000 counts in the example of FIG. 4). And within this range, a range in which the PLT (100) orientation rate is not less than 85% may be considered to be the range in which the crystallinity and the orientation rate of PLT (100) are satisfactory. Therefore, in FIG. 4, the range in which the Pt (111) peak intensity is α to β (the range of 17×10000 counts to 35×10000 counts in the example of FIG. 4) is the range in which the crystallinity and the orientation rate of PLT (100) are satisfactory. In other words, the substrate setting temperature during the forming of the Pt/Ti laminated film is preferably set such that the Pt (111) peak intensity is within the range of α to β in FIG. 4.

Although a preferred embodiment of the present invention has been described above, the present invention may also be implemented in yet other preferred embodiments. For example, in the preferred embodiment described above, the lead barrier film 3 is formed on the insulating film 2 and the piezoelectric element 10 is formed such as to contact the front surface of the lead barrier film 3. However, the lead barrier film 3 does not have to be formed on the insulating film 2. That is, the piezoelectric element 10 is formed such as to contact a front surface of the insulating film 2.

Although in the preferred embodiment described above, the piezoelectric film 13 is formed by the sol-gel method, it may be formed by the sputtering method instead.

Besides the above, various design changes may be applied within the scope of the matters described in the claims.

Next, an application example of the piezoelectric element 10 of FIG. 1 shall be described with reference to FIG. 5A, FIG. 5B, and FIG. 6 to FIG. 11.

Figure 5B:
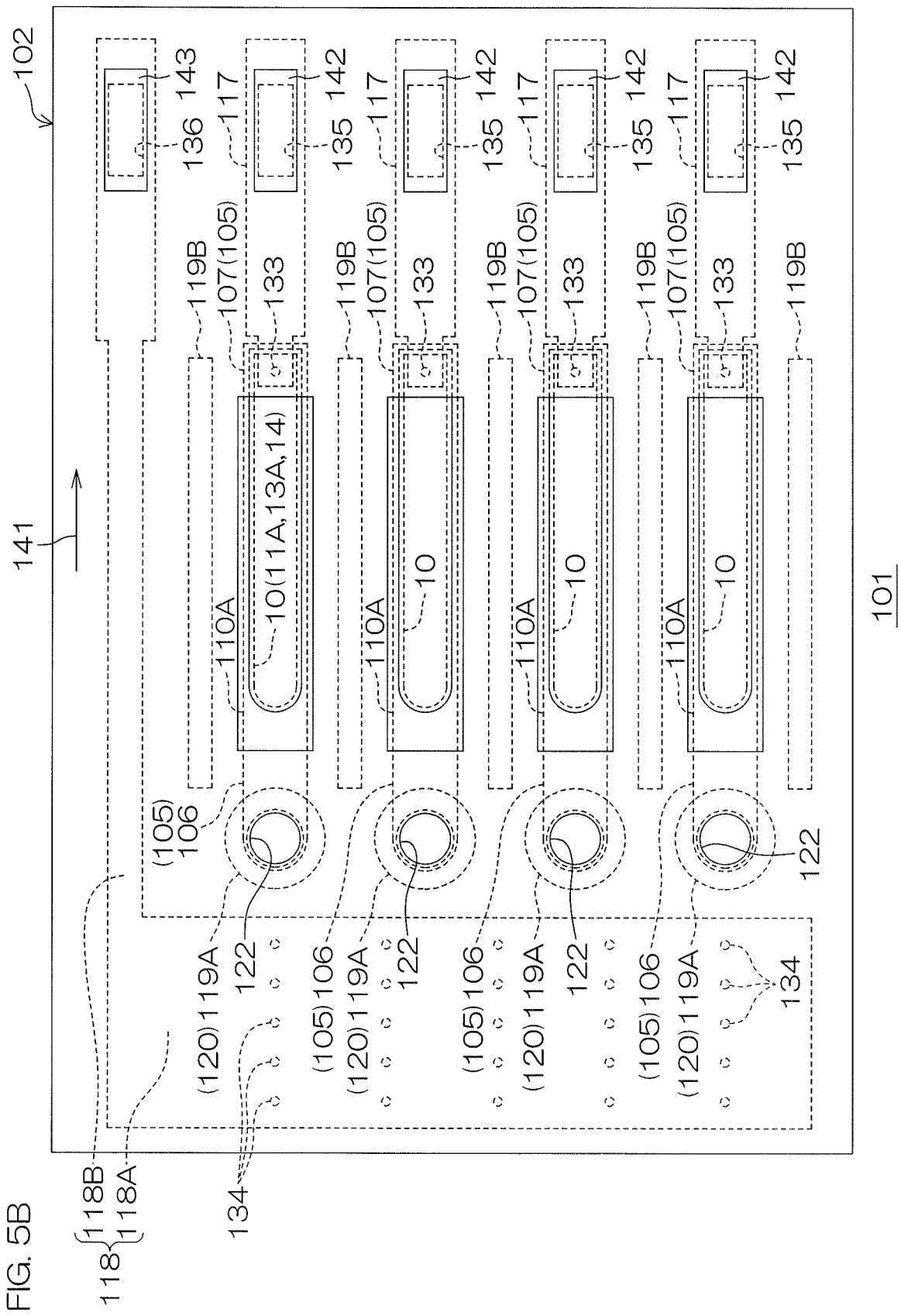
FIG. 5B is an illustrative plan view of the main portion of the inkjet printing head of FIG. 5A and is a plan view with a protective substrate omitted.
Figure 6:
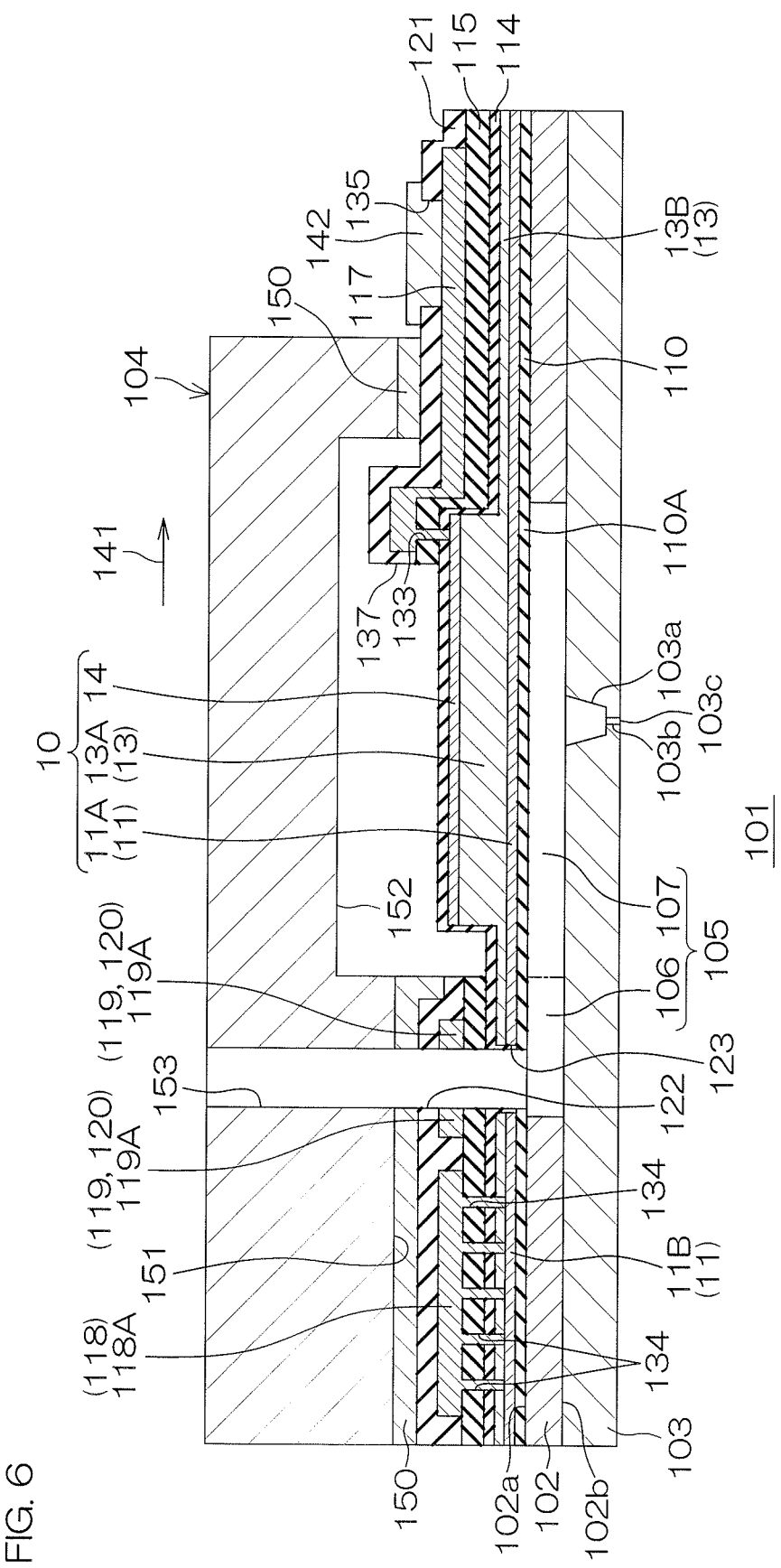
FIG. 6 is an illustrative sectional view taken along line VI-VI in FIG. 5A.
Figure 7:
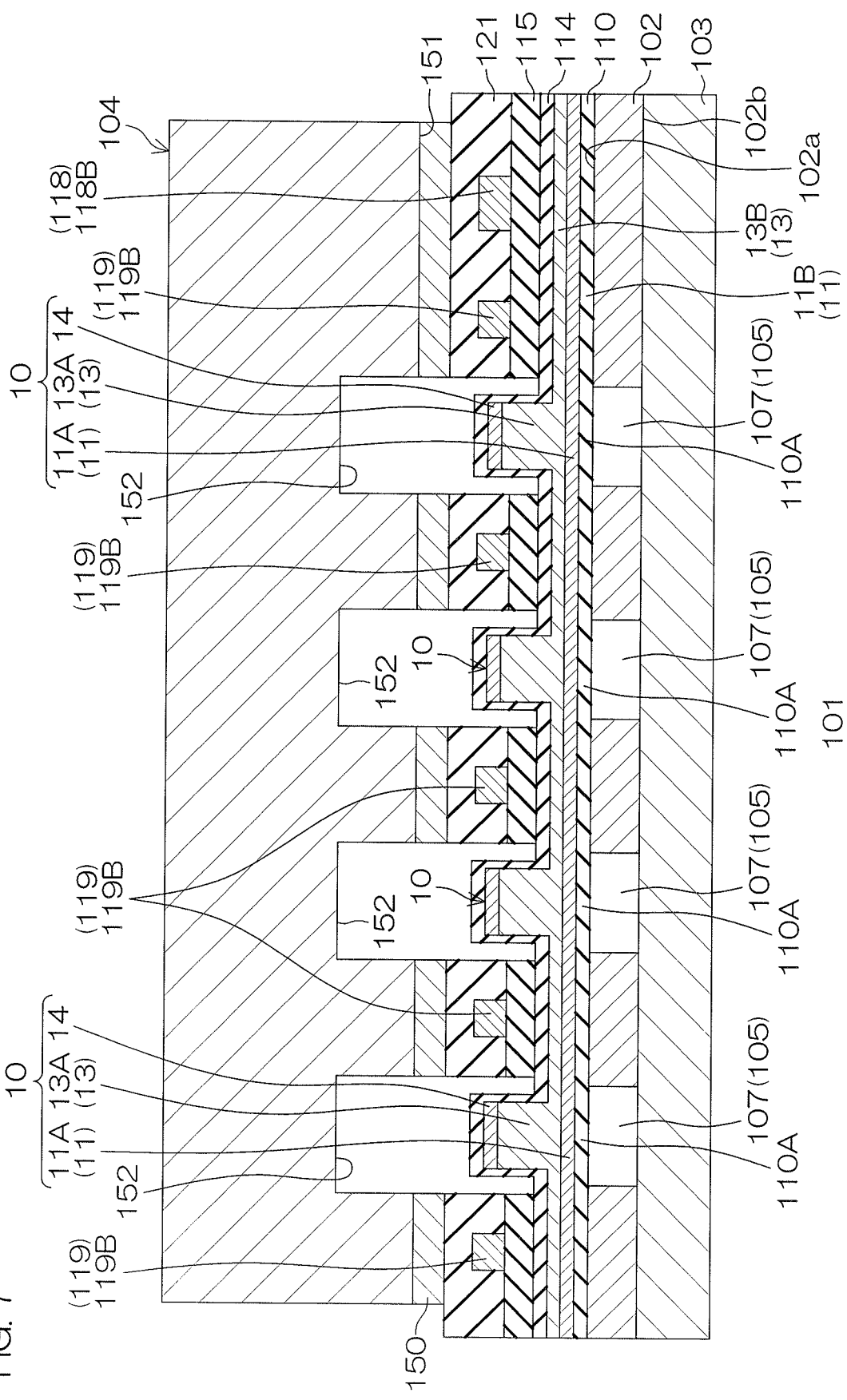
FIG. 7 is an illustrative enlarged sectional view of a portion of a section taken along line VII-VII in FIG. 5A.
Figure 8:
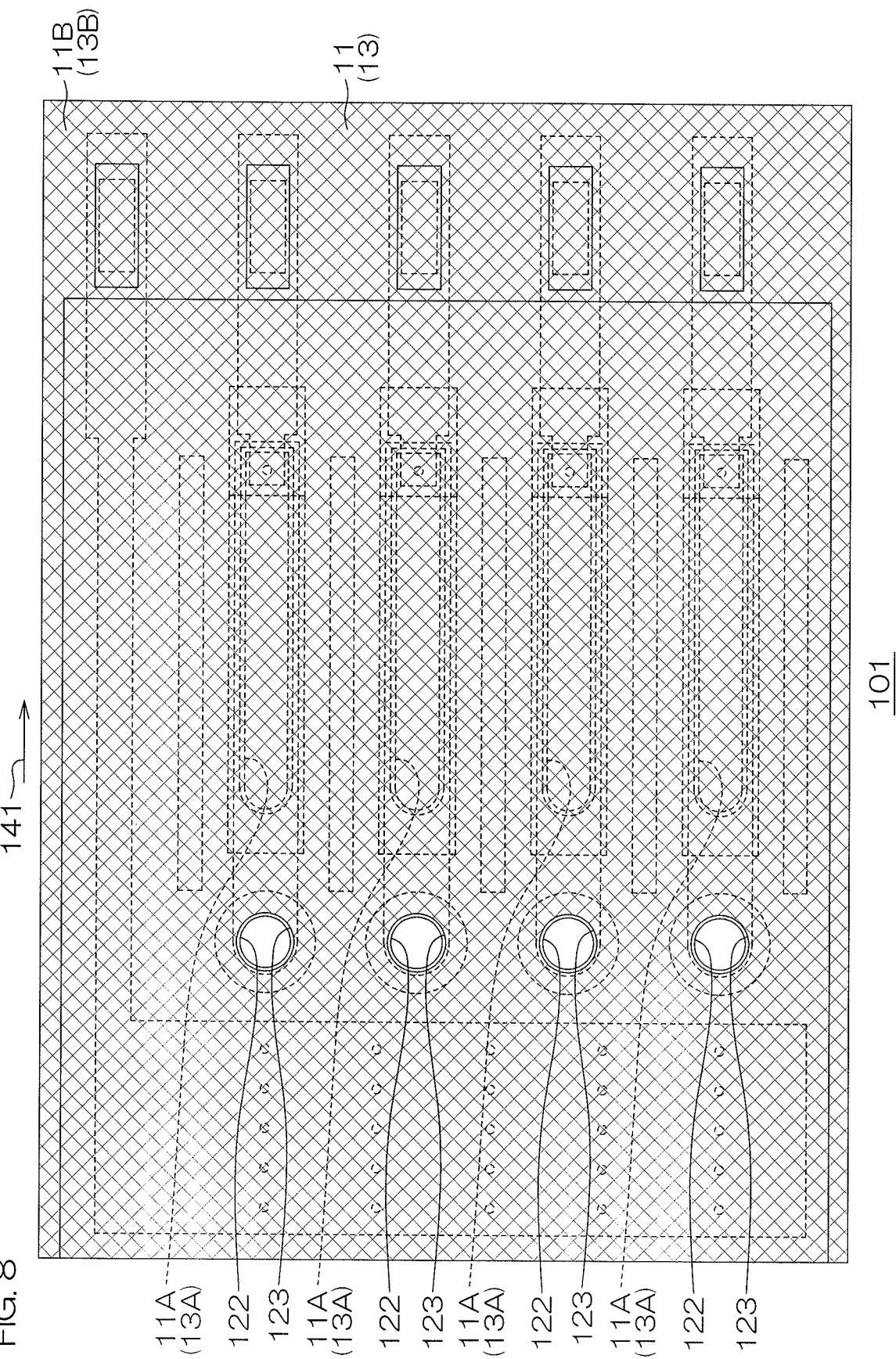
FIG. 8 is an illustrative plan view of a pattern example of a lower electrode and a piezoelectric film of the inkjet printing head of FIG. 5A.

FIG. 5A is an illustrative plan view for describing the arrangement of a main portion of an inkjet printing head in which the piezoelectric element 10 of FIG. 1 is used. FIG. 5B is an illustrative plan view of the main portion of the inkjet printing head of FIG. 5A and is a plan view with a protective substrate omitted. FIG. 6 is an illustrative sectional view taken along line VI-VI in FIG. 5A. FIG. 7 is an illustrative enlarged sectional view of a portion of a section taken along line VII-VII in FIG. 5A. FIG. 8 is an illustrative plan view of a pattern example of a lower electrode and a piezoelectric film of the inkjet printing head of FIG. 5A.

The arrangement of the inkjet printing head 101 shall now be described in outline with reference to FIG. 6.

The inkjet printing head 101 includes an actuator substrate 102, a nozzle substrate 103, and a protective substrate 104. A movable film formation layer 110 is laminated on a front surface of the actuator substrate 102. The actuator substrate 102 is equivalent to the substrate 1 of FIG. 1 and the movable film formation layer 110 is equivalent to the insulating film 2 of FIG. 1.

In the actuator substrate 102, ink flow passages (ink reservoirs) 105 are formed. In the present application example, the ink flow passages 105 are formed to penetrate through the actuator substrate 102. Each ink flow passage 105 is formed to be elongate along an ink flow direction 141, which is indicated by an arrow in FIG. 6. Each ink flow passage 105 is constituted of an ink inflow portion 106 at an upstream side end portion (left end portion in FIG. 6) in the ink flow direction 141 and a pressure chamber 107 (cavity) in communication with the ink inflow portion 106. In FIG. 6, a boundary between the ink inflow portion 106 and the pressure chamber 107 is indicated by an alternate long and two short dashed line.

The nozzle substrate 103 is constituted, for example, of a silicon substrate. The nozzle substrate 103 is adhered to a rear surface 102b of the actuator substrate 102. The nozzle substrate 103, together with the actuator substrate 102 and the movable film formation layer 110, defines the ink flow passages 105. More specifically, the nozzle substrate 103 defines bottom surface portions of the ink flow passages 105. The nozzle substrate 103 has recess portions 103a each facing a pressure chamber 107 and an ink discharge passage 103b is formed in a bottom surface of each recess portion 103a. Each ink discharge passage 103b penetrates through the nozzle substrate 103 and has a discharge port 103c at an opposite side from the pressure chamber 107. Therefore, when a volume change occurs in a pressure chamber 107, the ink retained in the pressure chamber 107 passes through the ink discharge passage 103b and is discharged from the discharge port 103c.

Each portion of the movable film formation layer 110 that is a top roof portion of a pressure chamber 107 constitutes a movable film 110A. The movable film 110A (movable film formation layer 110) is constituted, for example, of a silicon oxide ($SiO_2$) film formed on the actuator substrate 102. The movable film 110A (movable film formation layer 110) may be constituted of a laminated film, for example, of a silicon (Si) film formed on the actuator substrate 102, a silicon oxide ($SiO_2$) film formed on the silicon film, and a silicon nitride (SiN) film formed on the silicon oxide film.

In the present specification, the movable film 110A refers to a top roof portion of the movable film formation layer 110 that defines the top surface portion of the pressure chamber 107. Therefore, portions of the movable film formation layer 110 besides the top roof portions of the pressure chambers 107 do not constitute the movable film 110A.

Each movable film 110A has a thickness of, for example, 0.4 μm to 2 μm. If the movable film 110A is constituted of a silicon oxide film, the thickness of the silicon oxide film may be approximately 1.2 μm. If the movable film 110A is constituted of a laminated film of a silicon film, a silicon oxide film, and a silicon nitride film, the thickness of each of the silicon film, the silicon oxide film, and the silicon nitride film may be approximately 0.4 µm.

Each pressure chamber 107 is defined by a movable film 110A, the actuator substrate 102, and the nozzle substrate 103 and is formed to a substantially rectangular parallelepiped shape in the present application example. The pressure chamber 107 may, for example, have a length of approximately 800 µm and a width of approximately 55 µm. Each ink inflow portion 106 is in communication with one end portion in a long direction of a pressure chamber 107.

A piezoelectric element 10 is disposed on a front surface of each movable film 110A. Each piezoelectric element 10 includes a lower electrode 11 formed on the movable film formation layer 110, a seed layer (not shown) formed on the lower electrode 11, a piezoelectric film 13 formed on the seed layer, and an upper electrode 14 formed on the piezoelectric film 13.

Although the seed layer formed on the lower electrode 11 is equivalent to the seed layer 12 of FIG. 1, illustration thereof is omitted in the application example. Although in the present application example, a barrier film, equivalent to the lead barrier film 3 of FIG. 1, is not formed on the front surface of the movable film 110A, a barrier film, equivalent to the lead barrier film 3 of FIG. 1, may be formed.

The upper electrode 14 is constituted of a laminated film (Ir/IrO$_2$ laminated film) of an IrO$_2$ (iridium oxide) film formed on the piezoelectric film 13 and an Ir (iridium) film formed on the IrO$_2$ film 31. The upper electrode 14 may have a thickness, for example, of approximately 0.2 µm.

As the piezoelectric film 13, for example, a PZT (PbZr$_x$Ti$_{1-x}$O$_3$: lead zirconate titanate) film formed by a sol-gel method or a sputtering method is used. Such a piezoelectric film 13 is constituted of a sintered body of a metal oxide crystal. The piezoelectric film 13 includes active portions 13A, each in contact with a lower surface of an upper electrode 14, and an inactive portion 13B extending along a front surface of the movable film formation layer 110 from entire peripheries of side portions of the active portions 13A. The active portions 13A are formed to be of the same shape as the upper electrodes 14 in plan view.

Each active portion 13A has a thickness of approximately 1 µm. The inactive portion 13B has a thickness thinner than the thickness of the active portion 13A. The thickness of the inactive portion 13B is preferably not less than ½₀ and not more than ⅒ the thickness of the active portion 13A. The overall thickness of each movable film 110A is preferably approximately the same as the thickness of the active portion 13A or approximately ⅔ the thickness of the active portion 13A.

The seed layer (not shown) formed on the lower electrode 11 is a layer provided to improve the crystal orientation of the piezoelectric film 13 formed on the seed layer. The seed layer is formed to the same shape as the piezoelectric film 13 in plan view. In the present preferred embodiment, the seed layer is constituted from perovskite type lead lanthanum titanate (PLT: PbLaTiO$_3$).

The lower electrode 11 is constituted of a laminated film (Pt/Ti laminated film) of a Ti (titanium) film 21 formed on the movable film formation layer 110 and a Pt (platinum) film 22 formed on the Ti film 21. The lower electrode 11 has main electrode portions 11A, facing lower surfaces of the active portions 13A of the piezoelectric film 13, and an extension portion 11B extending along the front surface of the movable film formation layer 110 from entire peripheries of the main electrode portions 11A. The lower electrode 11 may have a thickness, for example, of approximately 0.2 µm.

A hydrogen barrier film 114 is formed on the inactive portion 13B of the piezoelectric film 13 and on the piezoelectric element 10. The hydrogen barrier film 114 is constituted, for example, of Al$_2$O$_3$ (alumina). The hydrogen barrier film 114 has a thickness of approximately 50 nm to 100 nm. The hydrogen barrier film 114 is provided to prevent degradation of characteristics of the piezoelectric film 13 due to hydrogen reduction.

An insulating film 115 is laminated on the hydrogen barrier film 114. The insulating film 115 is constituted, for example, of SiO$_2$ or low-hydrogen SiN, etc. The insulating film 115 has a thickness of approximately 500 nm. Upper wirings 117, a lower wiring 118, and dummy wirings 119 are formed on the insulating film 115. These wirings 117, 118, and 119 may be constituted of a metal material that includes Al (aluminum). These wirings 117, 118, and 119 have a thickness, for example, of approximately 1000 nm (1 µm).

One end portion of each upper wiring 117 is disposed above one end portion (downstream side end portion in the ink flow direction 141) of an upper electrode 14. A contact hole 133, penetrating continuously through the hydrogen barrier film 114 and the insulating film 115, is formed between the upper wiring 117 and the upper electrode 14. The one end portion of the upper wiring 117 enters into the contact hole 133 and is connected to the upper electrode 14 inside the contact hole 133. From above the upper electrode 14, the upper wiring 117 crosses an outer edge of the pressure chamber 107 and extends outside the pressure chamber 107.

The lower wiring 118 is disposed above the extension portion 11B of the lower electrode 11 at an opposite side from the pressure chamber 107 with respect to the ink inflow portion 106 of the ink flow passage 105. A plurality of contact holes 134, penetrating continuously through the seed layer (not shown), the inactive portion 13B of the piezoelectric film 13, the hydrogen barrier film 114, and the insulating film 115, are formed between the lower wiring 118 and the extension portion 11B of the lower electrode 11. The lower wiring 118 enters into the contact holes 134 and is connected to the extension portion 11B of the lower electrode 11 inside the contact holes 134.

The dummy wirings 119 are not electrically connected to either of the upper wirings 117 and the lower wiring 118 and are electrically insulated wirings. The dummy wirings 119 are formed in the same step as a step in which the upper wirings 117 and the lower wiring 118 are formed.

A passivation film 121, covering the wirings 117, 118, and 119 and the insulating film 115 is formed on the insulating film 115. The passivation film 121 is constituted, for example, of SiN (silicon nitride). The passivation film 121 may have a thickness, for example, of approximately 800 nm.

Pad openings 135 that expose portions of the upper wirings 117 are formed in the passivation film 121. The pad openings 135 are formed in a region outside the pressure chambers 107 and are formed, for example, at tip portions (end portions at opposite sides from the portions of contact with the upper electrodes 14) of the upper wirings 117. Pads 142 that cover the pad openings 135 are formed on the passivation film 121. The pads 142 enter into the pad openings 135 and are connected to the upper wirings 117 inside the pad openings 135.

Ink supply penetrating holes 122, penetrating through the passivation film 121, the insulating film 115, the hydrogen barrier film 114, the inactive portion 13B, the seed layer (not shown), the lower electrode 11, and the movable film formation layer 110 are formed at positions corresponding to end portions of the ink flow passages 105 at the ink inflow portion 106 sides. Penetrating holes 123, each including an ink supply penetrating hole 122 and being larger than the ink supply penetrating hole 122, are formed in the inactive portion 13B, the seed layer, and the lower electrode 11. The hydrogen barrier film 114 enters into gaps between the penetrating holes 123, in the inactive portion 13B, the seed layer, and the lower electrode 11, and the ink supply penetrating holes 122. The ink supply penetrating holes 122 are in communication with the ink inflow portions 106.

The protective substrate 104 is constituted, for example, of a silicon substrate. The protective substrate 104 is disposed above the actuator substrate 102 such as to cover the piezoelectric elements 10. The protective substrate 104 is bonded to the passivation film 121 via an adhesive 150. The protective substrate 104 has housing recesses 152 in a facing surface 151 that faces a front surface 102a of the actuator substrate 102. The piezoelectric elements 10 are housed inside the housing recesses 152. Further, the protective substrate 104 has formed therein ink supply passages 153 that are in communication with the ink supply penetrating holes 122. The ink supply passages 153 penetrate through the protective substrate 104. An ink tank (not shown) storing ink is disposed on the protective substrate 104.

Each piezoelectric element 10 is formed at a position facing a pressure chamber 107 across a movable film 110A. That is, the piezoelectric element 10 is formed to contact a front surface of the movable film 110A at the opposite side from the pressure chamber 107. Each pressure chamber 107 is filled with ink by the ink being supplied from the ink tank to the pressure chamber 107 through an ink supply passage 153, an ink supply penetrating hole 122, and an ink inflow portion 106. The movable film 110A defines a top surface portion of the pressure chamber 107 and faces the pressure chamber 107. The movable film 110A is supported by portions of the actuator substrate 102 at a periphery of the pressure chamber 107 and has flexibility enabling deformation in a direction facing the pressure chamber 107 (in other words, in the thickness direction of the movable film 110A).

The upper wirings 117 and the lower wiring 118 are connected to a drive circuit (not shown). Specifically, the pads 142 of the upper wirings 117 and the drive circuit are connected via a connecting metal member (not shown). As shall be described later, a pad 143 (see FIG. 5A) is connected to the lower wiring 118. The pad 143 of the lower wiring 118 and the drive circuit are connected via a connecting metal member (not shown). When a drive voltage is applied from the drive circuit to a piezoelectric element 10, the active portion 13A of the piezoelectric film 13 deforms due to an inverse piezoelectric effect. The movable film 110A is thereby made to deform together with the piezoelectric element 10 to bring about a volume change of the pressure chamber 107 and the ink inside the pressure chamber 107 is pressurized. The pressurized ink passes through the ink discharge passage 103b and is discharged as microdroplets from the discharge port 103c.

The arrangement of the inkjet printing head 101 shall now be described in more detail with reference to FIG. 5A to FIG. 8.

A plurality of the ink flow passages 105 (pressure chambers 107) are formed as stripes extending parallel to each other in the actuator substrate 102. The piezoelectric element 10 is disposed respectively in each of the plurality of ink flow passages 105. The ink supply penetrating holes 122 are provided respectively for each of the plurality of ink flow passages 105. The housing recesses 152 and the ink supply passages 153 in the protective substrate 104 are provided respectively for each of the plurality of ink flow passages 105.

The plurality of ink flow passages 105 are formed at equal intervals that are minute intervals (for example, of approximately 30 μm to 350 μm) in a width direction thereof. Each ink flow passage 105 is elongate along the ink flow direction 141. Each ink flow passage 105 is constituted of an ink inflow portion 106 in communication with an ink supply penetrating hole 122 and the pressure chamber 107 in communication with the ink inflow portion 106.

In plan view, the pressure chamber 107 has an oblong shape that is elongate along the ink flow direction 141. That is, the top surface portion of the pressure chamber 107 has two side edges along the ink flow direction 141 and two end edges along a direction orthogonal to the ink flow direction 141.

In plan view, the ink inflow portion 106 has substantially the same width as the pressure chamber 107. An inner surface of an end portion of the ink inflow portion 106 at an opposite side from the pressure chamber 107 is formed to a semicircle in plan view. The ink supply penetrating hole 122 is circular in plan view (see especially FIG. 5B).

Each piezoelectric element 10 has, in plan view, a rectangular shape that is long in a long direction of a pressure chamber 107 (movable film 110A). A length in a long direction of the piezoelectric element 10 is shorter than a length in the long direction of the pressure chamber 107 (movable film 110A). As shown in FIG. 5B, respective end edges along a short direction of the piezoelectric element 10 are disposed at inner sides at predetermined intervals respectively from respective corresponding end edges of the movable film 110A. Also, a width in the short direction of the piezoelectric element 10 is narrower than a width in a short direction of the movable film 110A. Respective side edges along the long direction of the piezoelectric element 10 are disposed at inner sides at predetermined intervals from respective corresponding side edges of the movable film 110A.

The lower electrode 11 is formed on substantially an entirety of the front surface of the movable film formation layer 110 (see especially FIG. 8). The lower electrode 11 is a common electrode used in common for the plurality of piezoelectric elements 10. The lower electrode 11 includes the main electrode portions 11A of rectangular shape in plan view that constitute the piezoelectric elements 10 and the extension portion 11B led out from the main electrode portions 11A in directions along the front surface of the movable film formation layer 110 to extend outside the peripheral edges of the top surface portions of the pressure chambers 107.

A length in a long direction of each main electrode portion 11A is shorter than the length in the long direction of each movable film 110A. Respective end edges of the main electrode portion 11A are disposed at inner sides at predetermined intervals respectively from the respective corresponding end edges of the movable film 110A. Also, a width in a short direction of the main electrode portion 11A is narrower than the width of the movable film 110A in the short direction. Respective side edges of the main electrode portion 11A are disposed at inner sides at predetermined intervals from the respective corresponding side edges of the movable film 110A. The extension portion 11B is a region of the entire region of the lower electrode 11 excluding the main electrode portions 11A.

In plan view, the upper electrodes 14 are formed to rectangular shapes of the same pattern as the main electrode portions 11A of the lower electrode 11. That is, a length in a long direction of each upper electrode 14 is shorter than the length in the long direction of each movable film 110A. Respective end edges of the upper electrode 14 are disposed at inner sides at predetermined intervals respectively from the respective corresponding end edges of the movable film 110A. Also, a width in a short direction of the upper electrode 14 is narrower than the width in the short direction of the movable film 110A. Respective side edges of the upper electrode 14 are disposed at inner sides at predetermined intervals from the respective corresponding side edges of the movable film 110A.

Figure 9:
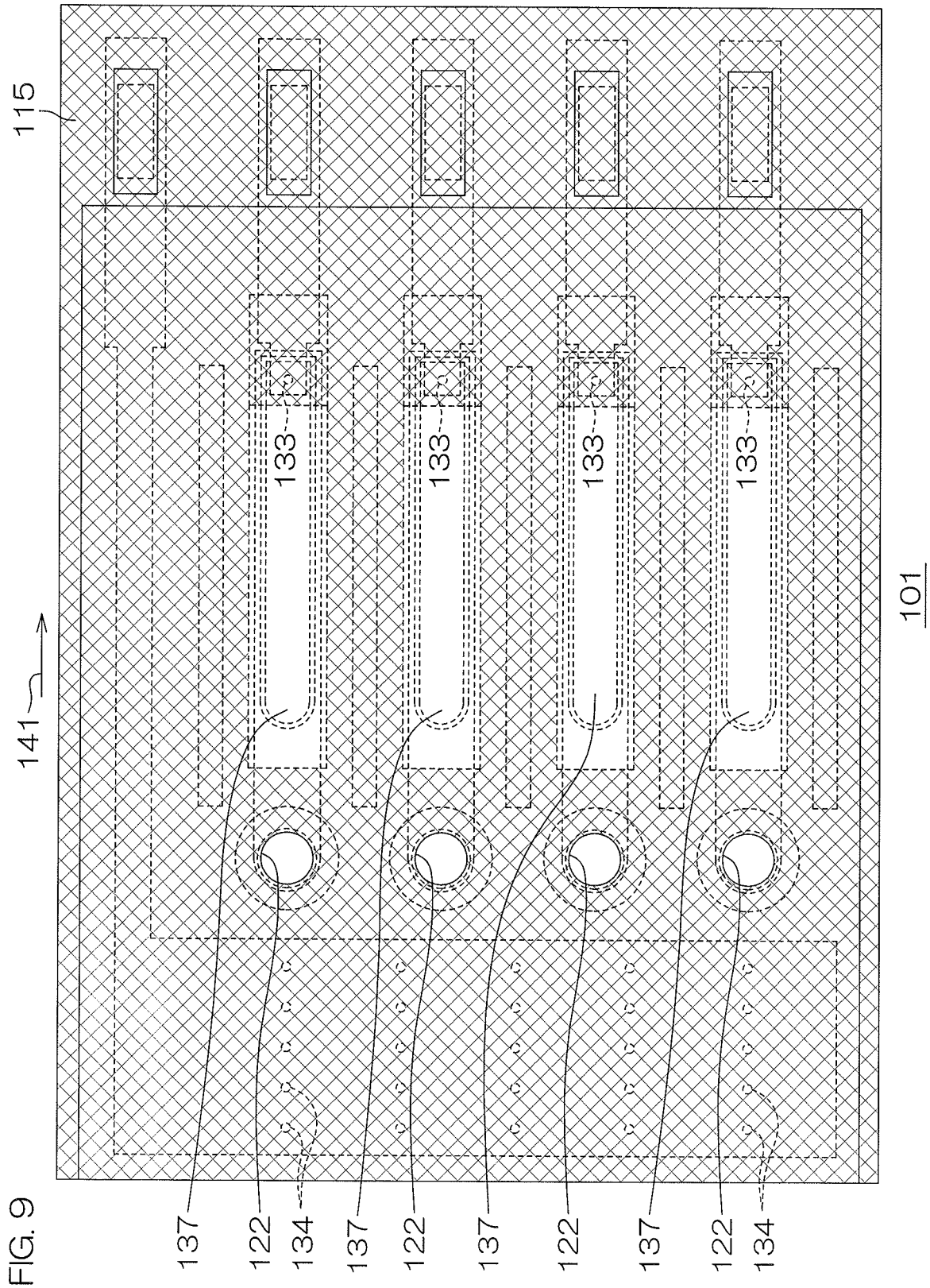
FIG. 9 is an illustrative plan view of a pattern example of an insulating film of the inkjet printing head of FIG. 5A.

In plan view, the piezoelectric film 13 is formed to be of the same pattern as the lower electrode 11 (see FIG. 9). That is, the piezoelectric film 13 is formed across substantially an entirety of the front surface of the movable film formation layer 110. As mentioned above, the piezoelectric film 13 includes the active portions 13A and the inactive portion 13B. In plan view, the active portions 13A are formed to rectangular shapes of the same pattern as the upper electrodes 14. That is, a length in a long direction of each active portion 13A is shorter than the length in the long direction of each movable film 110A. Respective end edges of the active portion 13A are disposed at inner sides at predetermined intervals respectively from the respective corresponding end edges of the movable film 110A. Also, a width in a short direction of the active portion 13A is narrower than the width in the short direction of the movable film 110A. Respective side edges of the active portion 13A are disposed at inner sides at predetermined intervals from the respective corresponding side edges of the movable film 110A. A lower surface of the active portion 13A contacts an upper surface of the main electrode portion 11A of the lower electrode 11 and an upper surface of the active portion 13A contacts a lower surface of the upper electrode 14.

In plan view, the inactive portion 13B is formed to be of the same pattern as the extension portion 11B of the lower electrode 11. The inactive portion 13B extends from entire peripheries of side walls of the active portions 13A to an outer side beyond the peripheral edges of the pressure chambers 107. An upper surface of the inactive portion 13B is covered by the hydrogen barrier film 114.

The seed layer formed on the lower electrode 11 is formed to be of the same pattern as the piezoelectric film 13 in plan view.

In the present application example, the piezoelectric film 13 includes the inactive portion 13B that is led out from the entire peripheries of the side portions of the active portions 13A in directions along the front surface of the movable film formation layer 110 and is thinner in thickness than the active portions 13A. Therefore, a path putting an upper electrode 14 and the lower electrode 11 in communication along an outer surface of the piezoelectric film 13 is made longer in length than in a case where the piezoelectric film 13 does not include the inactive portion 13B. Therefore, even if a metal thin film is formed on an outer surface of the piezoelectric film 13 in patterning the piezoelectric film 13 by etching, a leak path will be long and increase of leak current can thus be suppressed. Increase of leak current can also be suppressed because in patterning the piezoelectric film 13 by etching, a metal thin film is less likely to form on the upper surface of the inactive portion 13B than on side surfaces of the active portions 13A or on a side surface of the inactive portion 13B.

An annular region in each movable film 110A between peripheral edges of the movable film 110A and peripheral edges of the piezoelectric element 10 is a region that is not constrained by the piezoelectric element 10 or a peripheral wall of the pressure chamber 107 and is a region in which a large deformation occurs. That is, a peripheral edge portion of the movable film 110A is a region in which a large deformation occurs.

Therefore, when the piezoelectric element 10 is driven, the peripheral edge portion of the movable film 110A bends such that an inner peripheral edge side of the peripheral edge portion of the movable film 110A is displaced in a thickness direction of the pressure chamber 107 (downward in the present application example) and an entirety of a central portion surrounded by the peripheral edge portion of the movable film 110A is thereby displaced in the thickness direction of the pressure chamber 107 (downward in the present application example). Thus, cracking occurs readily in the peripheral edge portion of the movable film 110A because it is such a region in which a large deformation occurs.

In the present application example, the inactive portion 13B, in plan view, extends outward across the peripheral edges of the movable film 110A from the entire peripheries of the side surfaces of the active portions 13A. That is, the inactive portion 13B of the piezoelectric film 13 is interposed above the peripheral edge portions of the movable films 110A. Cracking of the peripheral edge portions of the movable film 110A can thus be suppressed.

Each upper wiring 117 extends from an upper surface of one end portion of a piezoelectric element 10 and along an end surface of the piezoelectric element 10 continuous to the upper surface and extends further along the front surface of the inactive portion 13B of the piezoelectric film 13 in a direction along the ink flow direction 141. The tip portion of the upper wiring 117 is disposed further downstream in the ink flow direction 141 than a downstream side end of the protective substrate 104.

The pad openings 135 that expose central portions of tip portion front surfaces of the upper wirings 117 are formed in the passivation film 121. The pads 142 are provided on the passivation film 121 such as to cover the pad openings 135. The pads 142 are connected to the upper wirings 117 inside the pad openings 135.

In plan view, the lower wiring 118 has a rectangular main wiring portion 118A that is long in a direction orthogonal to the ink flow direction 141 and a lead portion 118B extending along the ink flow direction 141 from one end portion of the main wiring portion 118A. A tip portion of the lead portion 118B is disposed further downstream in the ink flow direction 141 than the downstream side end of the protective substrate 104.

The lower wiring 118 enters into the plurality of contact holes 134 and is connected to the extension portion 11B of the lower electrode 11 inside the contact holes 134. A pad opening 136 that exposes a central portion of a tip portion front surface of the lead portion 118B is formed in the passivation film 121. The pad 143 is provided on the passivation film 121 such as to cover the pad opening 136. The pad 143 is connected to the lead portion 118B inside the pad opening 136.

Figure 11:
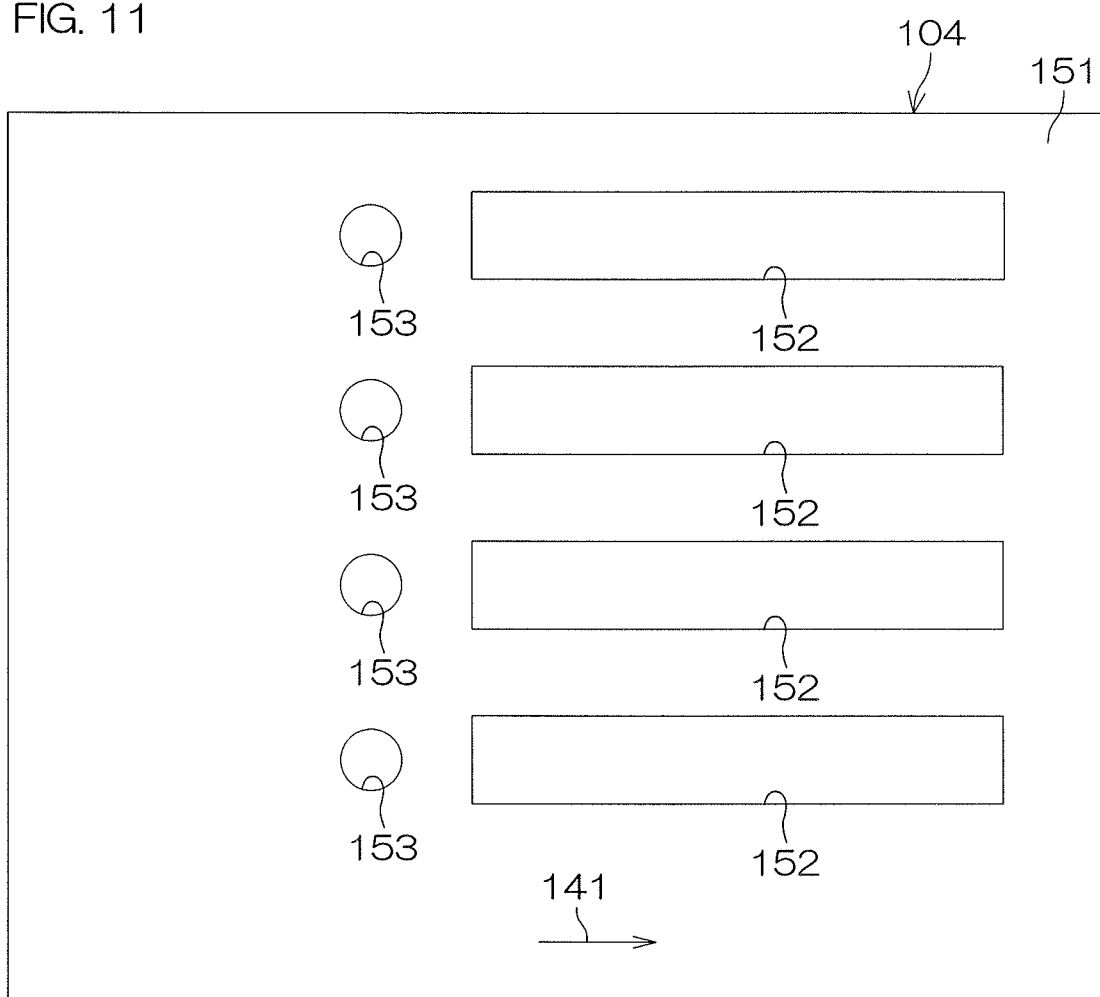
FIG. 11 is a bottom view of a main portion of the protective substrate as viewed from an actuator substrate side of the inkjet printing head of FIG. 5A.

FIG. 11 is a bottom view of a main portion of the protective substrate as viewed from the actuator substrate side of the inkjet printing head.

As shown in FIG. 5A, FIG. 7, and FIG. 11, in the facing surface 151 of the protective substrate 104, the plurality of housing recesses 152 are formed in parallel at intervals in a direction orthogonal to the ink flow direction 141. In plan view, the plurality of housing recesses 152 are disposed at positions facing the plurality of pressure chambers 107.

With respect to the respective housing recesses 152, the ink supply passages 153 are disposed at upstream sides in the ink flow direction 141. In plan view, each housing recess 152 is formed to a rectangular shape slightly larger than the pattern of the upper electrode 14 of the corresponding piezoelectric element 10. The corresponding piezoelectric element 10 is housed in each housing recess 152.

In plan view, the ink supply passages 153 of the protective substrate 104 have circular shapes of the same pattern as the ink supply penetrating holes 122 at the actuator substrate 102 side. In plan view, the ink supply passages 153 are matched with the ink supply penetrating holes 122.

In plan view, the dummy wirings 119 include first dummy wirings 119A of circular annular shapes that surround the ink supply passages 153 (ink supply penetrating holes 122). Above the actuator substrate 102, the first dummy wirings 119A are disposed in regions facing regions of the facing surface 151 of the protective substrate 104 peripheral to the ink supply passages 153. A width of each first dummy wiring 119A (difference between an inner diameter and an outer diameter of each first dummy wiring 119A) is preferably not less than 1/3 a diameter of each ink supply passage 153. Upper surfaces of the first dummy wirings 119A are flat. Each first dummy wiring 119A constitutes a base 120 that supports the protective substrate 104 and increases adhesion with the facing surface of the protective substrate 104.

The dummy wirings 119 further include second dummy wirings 119B of elongate rectangular shapes that are formed at width central portions of regions between adjacent pressure chambers 107 and at outward sides of the pressure chambers 107 at respective outer sides of the set of plurality of pressure chambers and extend in the direction along the ink flow direction 141. Upper surfaces of the second dummy wirings 119B are flat. Each second dummy wiring 119B constitutes a base that supports the protective substrate 104 and increases adhesion with the facing surface of the protective substrate 104.

In bonding the protective substrate 104 to the actuator substrate 102, the protective substrate 104 is pressed against the actuator substrate 102 in a state where the adhesive 150 is coated on a portion of bonding of the actuator substrate 102 and the protective substrate 104. In this process, the facing surface 151 of the protective substrate 104 is pressed via the passivation film 121 against the first dummy wirings 119A and the second dummy wirings 119B that are the bases with flat upper surfaces.

The facing surface 151 of the protective substrate 104 is thus bonded firmly via the passivation film 121 and the adhesive 150 to the upper surfaces of the first dummy wirings 119A and the second dummy wirings 119B. Defective adhesion is thus made unlikely to occur at the portion of bonding of the facing surface 151 of the protective substrate 104 and the actuator substrate 102.

In the present application example, by the first dummy wirings 119A (bases 120) of circular annular shapes surrounding the ink supply passages 153 (ink supply penetrating holes 122) being provided at the actuator substrate 102 side, occurrence of defective bonding between lower surfaces of wall portions of the protective substrate 104 between the housing recesses 152 and the ink supply passages 153 and the actuator substrate 102 can be suppressed. Leakage of ink into a housing recess 152 from an ink supply passage 153 can thereby be suppressed.

Figure 10:
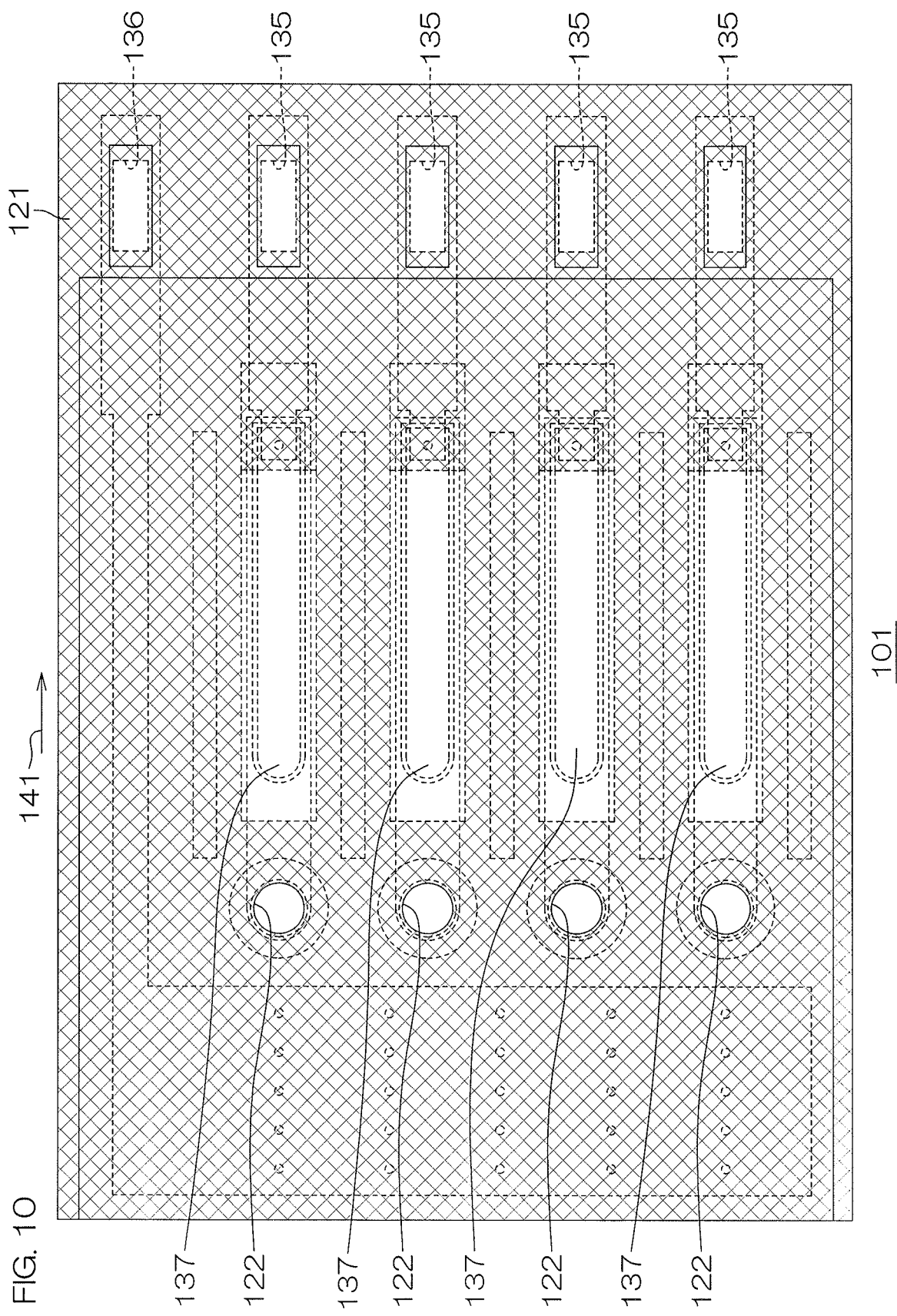
FIG. 10 is an illustrative plan view of a pattern example of a passivation film of the inkjet printing head of FIG. 5A.

FIG. 9 is an illustrative plan view of a pattern example of the insulating film of the inkjet printing head. FIG. 10 is an illustrative plan view of a pattern example of the passivation film of the inkjet printing head.

In the present application example, above the actuator substrate 102, the insulating film 115 and the passivation film 121 are formed on substantially an entirety of a region of the protective substrate 104 outside the housing recesses 152 in plan view. However, in this region, the ink supply penetrating holes 122 and the contact holes 134 are formed in the insulating film 115. In this region, the ink supply penetrating holes 122 and the pad openings 135 and 136 are formed in the passivation film 121.

In the regions of the protective substrate 104 inside the housing recesses 152, the insulating film 115 and the passivation film 121 are formed just in one end portions (upper wiring regions) in which the upper wirings 117 are present. In each of these regions, the passivation film 121 is formed to cover an upper surface and a side surface of an upper wiring 117 on the insulating film 115. In other words, in the insulating film 115 and the passivation film 121, openings 137 are formed in regions, within the inner side regions of the housing recesses 152 in plan view, that exclude the upper wiring regions. The contact holes 133 are further formed in the insulating film 115.

In the present application example, in a region at the inner side of the peripheral edge of each pressure chamber 107 in plan view, the insulating film 115 and the passivation film 121 are formed just in the upper wiring region in which an upper wiring 117 is present. Therefore, most of the side surface and the upper surface of each piezoelectric element 10 are not covered by the insulating film 115 and the passivation film 121. Displacement of each movable film 110A can thereby be increased in comparison to a case where entireties of the side surface and the upper surface of the piezoelectric element 10 are covered by the insulating film and the passivation film.

The present application corresponds to Japanese Patent Application No. 2017-171445 filed in the Japan Patent Office on Sep. 6, 2017 and Japanese Patent Application No. 2018-152009 filed in the Japan Patent Office on Aug. 10, 2018, and the entire disclosures of these applications are incorporated herein by reference.

While preferred embodiments of the present invention have been described above, it is to be understood that variations and modifications will be apparent to those skilled in the art without departing the scope and sprit of the present invention. The scope of the present invention, therefore, is to be determined solely by the following claims.

What is claimed is:

1. A piezoelectric element comprising: an insulating film, formed on a substrate; a lead barrier film, formed on the insulating film; a lower electrode, formed on the lead barrier film; a seed layer, formed on the lower electrode and comprised of a sputtered film having lead lanthanum titanate (PLT) as a main component; and a piezoelectric film, formed on the seed layer and having lead zirconate titanate (PZT) or lead lanthanum zirconate titanate (PLZT) as a main component; and wherein the lower electrode is comprised of a laminated film of a Ti film at the substrate side and a Pt film laminated on the Ti film, the piezoelectric element being such that a (111) orientation peak intensity of the Pt constituting the Pt film is 17×10000 counts to 35×10000 counts and a (100) orientation peak intensity of the PLT constituting the seed layer is not less than 70×1000 counts, and a film thickness of the lead barrier film is thinner than a film thickness of the insulating film.

2. The piezoelectric element according to claim 1, wherein a film thickness of the seed layer is 20 nm to 100 nm, a film thickness of the Pt film is 50 nm to 200 mm, and a film thickness of the Ti film is not more than 10 nm.

3. The piezoelectric element according to claim 1, wherein the piezoelectric film is a piezoelectric film formed by a sol-gel method.

4. The piezoelectric element according to claim 1, wherein the seed layer has, near the lower electrode side, a Pb-rich layer high in Pb concentration.

5. The piezoelectric element according to claim 1, further comprising: an upper electrode formed on the piezoelectric film.

6. The piezoelectric element according to claim 1, wherein the insulating film comprises $SiO_2$.

7. The piezoelectric element according to claim 6, wherein the lead barrier film comprises $Al_2O_3$.

8. The piezoelectric element according to claim 6, wherein a film thickness of the insulating film is 300 nm to 2000 nm.

9. The piezoelectric element according to claim 7, wherein a film thickness of the insulating film is 300 nm to 2000 nm and a film thickness of the lead barrier film is 50 nm to 100 nm.

\* \* \* \* \*